United States Patent
Lagowski

[19]

[11] Patent Number: 5,977,788
[45] Date of Patent: Nov. 2, 1999

[54] ELEVATED TEMPERATURE MEASUREMENT OF THE MINORITY CARRIER LIFETIME IN THE DEPLETION LAYER OF A SEMICONDUCTOR WAFER

[76] Inventor: Jacek Lagowski, 11504 Norval Pl., Tampa, Fla. 33617

[21] Appl. No.: 08/893,857

[22] Filed: Jul. 11, 1997

[51] Int. Cl.⁶ .................................................. G01R 31/26
[52] U.S. Cl. ........................................... 324/765; 324/767
[58] Field of Search .................................. 324/765, 766, 324/767, 752

[56] References Cited

U.S. PATENT DOCUMENTS

| | | | |
|---|---|---|---|
| 4,168,432 | 9/1979 | Williams et al. | 250/370 |
| 4,599,558 | 7/1986 | Castellano, Jr. et al. | 324/158 |
| 4,744,833 | 5/1988 | Cooper et al. | 134/1 |
| 4,812,756 | 3/1989 | Curtis et al. | 324/158 |
| 4,950,977 | 8/1990 | Garcia et al. | 324/71.1 |
| 4,978,915 | 12/1990 | Andrews, Jr. et al. | 324/158 |
| 5,049,816 | 9/1991 | Moslehi | 324/767 |
| 5,091,691 | 2/1992 | Kamieniecki et al. | 324/765 |
| 5,216,362 | 6/1993 | Verkuil | 324/158 |
| 5,394,101 | 2/1995 | Mitros | 324/760 |
| 5,406,214 | 4/1995 | Boda et al. | 324/765 |
| 5,410,162 | 4/1995 | Tigelaar et al. | 257/48 |
| 5,453,703 | 9/1995 | Goldfarb | 324/765 |
| 5,773,989 | 6/1998 | Edelman et al. | 324/765 |

OTHER PUBLICATIONS

Bickley, "Quantox™ Non–Contact Oxide Monitoring System", Keithley Instruments, Inc., (1995) (No month).
Edelman, "New approach to measuring oxide charge and mobile ion concentration", SPIE, 2337:154–164, (Oct. 1994).
Horner et al., "COS–Based Q–V Testing: In–line Options for Oxide charge Monitoring", IEEE, 63–67, (1995) (No month).

*Primary Examiner*—Vinh P. Nguyen
*Assistant Examiner*—T. R. Sundaram
*Attorney, Agent, or Firm*—Fish & Richardson P.C.

[57] ABSTRACT

A method for determining the depletion layer minority carrier lifetime $\tau_o$ in a depletion layer of a semiconductor wafer includes the following. A depletion layer is induced on a surface of the wafer. The wafer is heated to a temperature $T_1$. A surface photovoltage is induced on the surface of the wafer with modulated light. A surface photovoltage $\Delta V_{o1}$ is measured at a selected point of the wafer, at $T_1$ and at a low light modulation frequency where the surface photovoltage is substantially independent of frequency. A surface photovoltage $\Delta V_1$ is measured at the selected point, at $T_1$ and at a higher light modulation frequency $\omega$ which is within a frequency range where the surface photovoltage is inversely proportional to frequency. A surface photovoltage response time $\tau_{max1}$ is determined by the relationship: $\tau_{max1} = \omega_1^{-1}[(\Delta V_{o1}/\Delta V_1)^2 - 1]^{1/2}$. The wafer is heated to a temperature $T_2$, greater than the temperature $T_1$. A surface photovoltage $\Delta V_{o2}$ is measured at the selected point, at $T_2$ and at the low light modulation frequency. A surface photovoltage $\Delta V_2$ is measured at the selected point, at $T_2$ and at a frequency $\omega_2$ in a range where the photovoltage is inversely proportional to frequency. A surface photovoltage response time $\tau_{max2}$ is determined by the relationship $\tau_{max2} = \omega_2^{-1}[(\Delta V_{o2}/\Delta V_2)^2 - 1]^{1/2}$. The room temperature depletion layer lifetime $\tau_o$ is determined by the relationship:

$$\tau_o = \tau_{max2} \cdot \exp[(T_2 - T_0)E_A/kT_o \cdot T_2],$$

where $T_o$ is room temperature.

14 Claims, 6 Drawing Sheets

ELEVATED TEMPERATURE MEASUREMENT OF THE MINORITY CARRIER LIFETIME IN THE DEPLETION LAYER OF A SEMICONDUCTOR WAFER

BACKGROUND OF THE INVENTION

The invention relates to determining the minority carrier lifetime in the depletion layer of a semiconductor wafer.

The performance and reliability of semiconductor electronic and optoelectronic devices, and the integrated circuits into which they are incorporated, depends in part upon the purity of the semiconductor from which the devices are made, and, in particular, on the level of contaminants or impurities which may be introduced during manufacture and processing. One measure of the level of impurities used in quality control is the determination of the minority carrier lifetime. When a minority carrier is introduced into a region where carriers of opposite polarity (i.e, majority carriers) are present, there is a tendency for recombination and a consequent annihilation of the minority carrier. The lifetime of a carrier depends on how many impurities or defects which form sites where the recombination occurs are present. The distance that the carrier travels during their lifetime is called the diffusion length. Both the lifetime and the diffusion length provide a measure of the impurity or defect concentration.

There are two types of minority carrier lifetime, the recombination lifetime $\tau_R$ (discussed above) and the generation lifetime $\tau_G$. These lifetimes are distinguished based on their relationship to electron-hole recombination and electron-hole generation, respectively.

In silicon, both of these processes are governed by impurity or defect levels $E_T$. In a p-type semiconductor, the recombination lifetime is related to an annihilation of electrons (excess minority carriers). The recombination is very efficient in the bulk region where free holes (majority carriers) are present. The generation lifetime relates to an opposite process. That is the creation of the minority carriers due to thermal generation. Again, the impurities and defects serve as sites for the generation. The generation lifetime is important in the depletion layer where virtually no majority carriers are present and thus the recombination is very inefficient.

The depletion layer generation lifetime is ideally suited for monitoring impurities or defects in these semiconductor layers such as epitaxial layers and denuded zones which are extensively utilized in semiconductor microelectronic devices and circuits.

Determining lifetime using surface photovoltage (i.e., the change of the surface potential caused by illumination) techniques has been limited to measuring the recombination lifetime, including the bulk recombination lifetime $\tau_R$, the effective recombination lifetime $\tau_{eff}$ which contains contributions from recombination in the bulk and at the surface; and the surface recombination lifetime $\tau_s$. SPV surface recombination lifetime measuring tools are being produced by Semitest, Inc., Billerica, Mass. and QC Solutions, Woburn, Mass. Both of these tools perform single frequency, room temperature SPV measurements.

Measurement of the depletion layer generation lifetime in thin epitaxial layers, on the other hand, has been limited to those techniques which utilize test junctions or test MOS capacitors. Another method uses a corona charge pulse applied to a small site on the surface and determines the generation lifetime from the contact potential transient following the pulse. These approaches use capacitance transient measurements in response to a bias pulse applied to the junction or to the gate of the MOS device (see Kang et al., The Pulsed MIS Capacitor, *Phys. Stnt. Sol.* 89:13, 1985).

SUMMARY OF THE INVENTION

This invention provides a method for measuring the surface photovoltage (SPV) under experimental conditions which highlight minority carrier generation lifetime $\tau_G$ associated with the depletion layer in a thin epitaxial layer of a semiconductor wafer. This generation lifetime characteristic refers selectively to the creation of minority carriers due to thermal generation via impurity or defect levels within the depletion layer. In particular, the magnitude of SPV is measured at elevated temperatures within an optimum range as a function of a modulation frequency of illuminating light. Measuring the magnitude of SPV as a function of frequency in the optimum elevated temperature range ensures that the measurement is representative of the depletion layer generation lifetime and not from other minority carrier supply mechanisms.

In one aspect of the invention, the method for determining the depletion layer minority carrier lifetime $\tau_G$ in a depletion layer of a semiconductor wafer includes the following steps. A first surface photovoltage $\Delta V_{o1}$ is measured at a selected point of the wafer, at a temperature $T_1$ in a range between 30–100° C. and at a low light modulation frequency. A second surface photovoltage $\Delta V_1$ is measured at the selected point, at a temperature $T_2$ and at a frequency $\omega_2$ within the frequency range where the surface photovoltage is inversely proportional to frequency. A surface photovoltage response time $\tau_{max1}$ of the selected point is determined by:

$$\tau_{max1}=\omega_2^{-1}[(\Delta V_{o1}/\Delta V_1)-1]^{1/2};\text{ and}$$

the depletion layer lifetime $\tau_o$ is determined by:

$$\tau_o=\tau_{max1}\cdot\exp[(T_2-T_0)E_A/kT_o\cdot T_2]$$

where $T_o$ is room temperature.

In another aspect of the invention, the method for determining the depletion layer minority carrier lifetime $\tau_G$ in a depletion layer of a semiconductor wafer includes the following steps. A depletion or inversion layer is induced on a surface of the semiconductor wafer. The wafer is then heated to a first temperature $T_1$ in a range between 30–100° C. A surface photovoltage is induced on the surface of the semiconductor wafer with modulated light. A first surface photovoltage $\Delta V_{o1}$ is measured at a selected point of the wafer, at $T_1$ and at a low light modulation frequency where the surface photovoltage is substantially independent of frequency. A second surface photovoltage $\Delta V_1$ is measured at the selected point, at $T_1$ and at a higher light modulation frequency $\omega$ ($\omega=2\pi f$ is the angular frequency, where f is the standard modulation frequency) which is within a frequency range where the surface photovoltage is inversely proportional to frequency. A first surface photovoltage response time $\tau_{max1}$ is determined by the relationship: $\tau_{max1}=\omega_1^{-1}[(\Delta V_{o1}/\Delta V_1)^2-1]^{1/2}$. The semiconductor wafer is heated to a second temperature $\tau_2$, greater than the first temperature $T_1$ and in the range between 30–90° C. A third surface photovoltage $\Delta V_{o2}$ is measured at the selected point, at $T_2$ and at the low light modulation frequency. A fourth surface photovoltage $\Delta V_2$ is measured at the selected point, at $T_2$ and at a frequency $\omega_2$ in a range where the photovoltage is inversely proportional to frequency. A second surface photovoltage response time $\tau_{max2}$ is determined by the relationship $\tau_{max2}=\omega_2^{-1}[(\Delta V_{o2}/\Delta V_2)^2-1]^{1/2}$. The room temperature depletion layer lifetime $\tau_G$ is determined by the relationship:

$$\tau_G = \tau_{max2} \cdot \exp\left[(T_2 - T_0)E_A/kT_o \cdot T_2\right],$$

where $T_o$ is room temperature.

Preferred embodiments of this aspect include one or more of the following features. Before determining the depletion layer lifetime $T_o$, a response time activation energy $E_A$ based on the following relationship is calculated: $E_A = k(\ln \tau_{max1}/\tau_{max2})(T_1 \cdot T_2)/(T_2 - T_1)$. The value of $E_A$ provides an indication of the validity of the depletion layer minority carrier lifetime measurement. For example, for silicon, the value of $E_A$ should be in a range between 0.4 to 0.7 eV and preferably close to 0.55 eV. If the value of $E_A$ is outside this range, would indicate that a minority carrier supply mechanism other than that associated with the generation lifetime is dominating the measurement.

For silicon, the optimum elevated temperature range is between 40 and 80° C. For example, temperature $T_1$ is preferably in a range between about 40 and 60° C., while temperature $T_2$ is in a range between about 60 and 80° C. The low light modulation frequency is preferably in a range between 0.1 to 100 Hz and frequency $\omega$ (where the surface photovoltage is inversely proportional to frequency) is in a range between 100 to 5 KHz.

In order to ensure that the depletion layer has a weak surface inversion layer, in one embodiment, the method includes a step performed prior to heating the semiconductor wafer to temperature $T_1$. This step includes adjusting the surface barrier to ensure that it is within an optimal range defined by:

$$\frac{kT}{q}\ln\frac{N_a}{n_i} \leq V_s < 2\frac{kT}{q}\ln\frac{N_a}{n_i}.$$

Depending on the value of $V_s$, either positive or negative corona is applied to the wafer surface until $V_s$ is in the desired range.

In another aspect of the invention, a system for determining the depletion layer minority carrier lifetime $\tau_G$ comprises a measurement device configured to measure a series of surface photovoltages including a first surface photovoltage $\Delta V_{o1}$ at a first temperature $T_1$ and at a low light modulation frequency where the surface photovoltage is independent of frequency; a second surface photovoltage $\Delta V_1$ at $T_1$ and at a frequency $\omega$ which is higher than the low light modulation frequency and where the surface photovoltage is inversely proportional to frequency; a third surface photovoltage $\Delta V_{o2}$ at a second temperature $T_2$ and at the low light modulation frequency; a fourth surface photovoltage $\Delta V_2$ at $T_2$ and at the frequency. The system also includes a controller which receives electrical signals representative of the first, second, third and fourth photovoltages and determines a first surface photovoltage response time $\tau_{max1}$ by:

$$\tau_{max1} = \omega_1^{-1}[(\Delta V_{o1}/\Delta V_1)^2 - 1]^{1/2};$$

a second surface photovoltage response time $\tau_{max2}$ by:

$$\tau_{max2} = \omega_2^{-1}[(\Delta V_{o2}/\Delta V_2)^2 - 1]^{1/2}); \text{ and}$$

a depletion layer lifetime $\tau_o$ by:

$$\tau_0 = \tau_{max2} \cdot \exp\left[(T_2 - T_0)E_A/kT_0 \cdot T_2\right]$$

where $T_0$ is room temperature.

In embodiments of this aspect, the system may include one or more of the following additional features. The system includes a first variable-temperature wafer stage configured to support and heat the semiconductor wafer at temperature $T_1$ and a second variable-temperature wafer stage configured to support and heat the semiconductor wafer at temperature $T_2$. The system may also include a charge deposition device configured to induce a depletion or inversion layer on the surface of the semiconductor wafer.

Among other advantages, the invention provides a non-contact approach for measuring the generation lifetime without requiring the fabrication of separate test junctions or test MOS capacitors. Elevating the temperature at which the SPV measurements are performed accelerates the minority carrier generation and permits to perform measurement many timer faster than standard measurements at room temperature. This enables mapping the entire wafer in a practical amount of time (e.g., below 30 min, whereas room temperature measurements would take days).

Embodiments of the invention may include one or more of the following features.

The invention is particularly well suited for characterizing oxidized epitaxial silicon wafers having epitaxial layers on highly doped substrates of the same conductivity type as the epitaxial layer (e.g., $n/n^+$ and $p/p^+$) or oxidized wafers with denuded zones (i.e., thermally treated to remove contaminants during wafer manufacturing).

Other features and advantages will become apparent from the following description and from the claims.

DESCRIPTION

Figure 1:
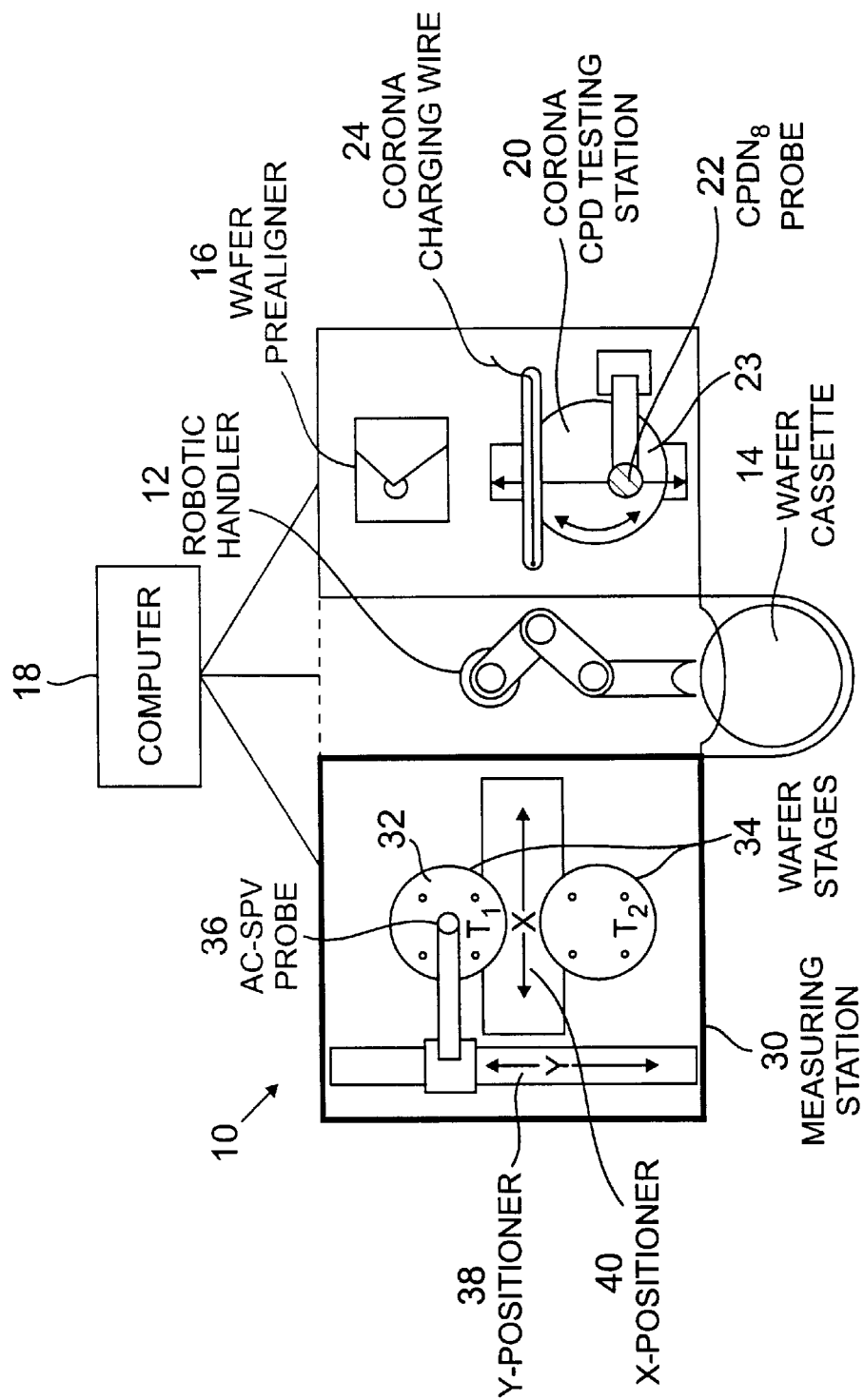
FIG. 1 is a plan view of the measurement system according to the invention.

Referring to FIG. 1, a computer controlled test system 10 for measuring the generation lifetime of thin epitaxial layers deposited over a semiconductor wafer 2 (FIG. 2A) formed of semiconductor silicon is shown. Test system 10 includes a corona charging and surface barrier (CCSB) measurement station 20, an elevated surface photovoltage (AC-SPV) measurement station 30, a prealigner station 16, and a robotic wafer handler 12 for moving wafer 2 about the stations of the system. A computer 18 controls robotic wafer handler 12 and transmits control signals to and receives data signals from cassette holder 14, CCSB measurement station 20, elevated AC-SPV measurement station 30 and positioners associated with the measurement stations.

CCSB station 20 and the AC-SPV measuring station 30 in are placed in dark boxes which prevent stray light interference in during measurements.

Figure 2A:
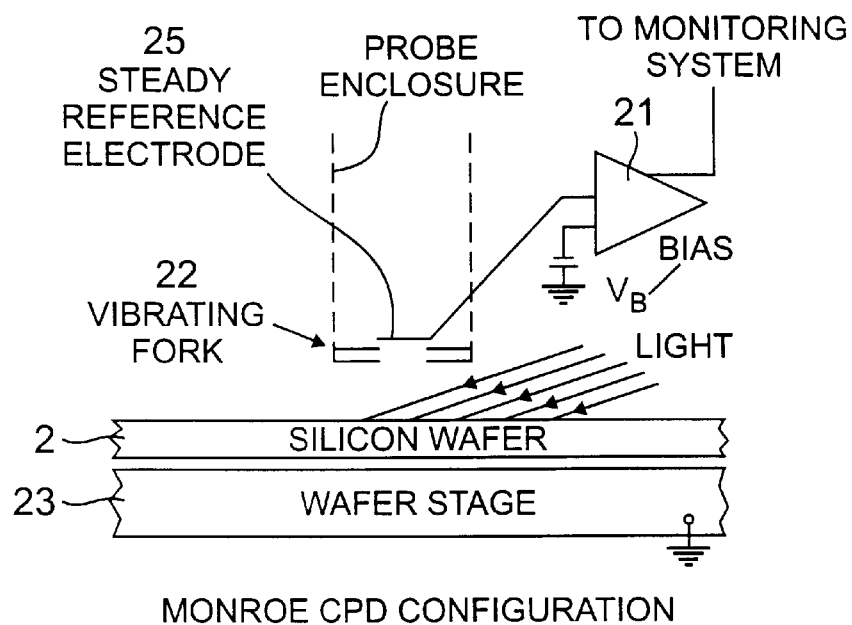
FIGS. 2A and 2B are diagrammatic views of Monroe and Kelvin probe systems, respectively.
Figure 2B:
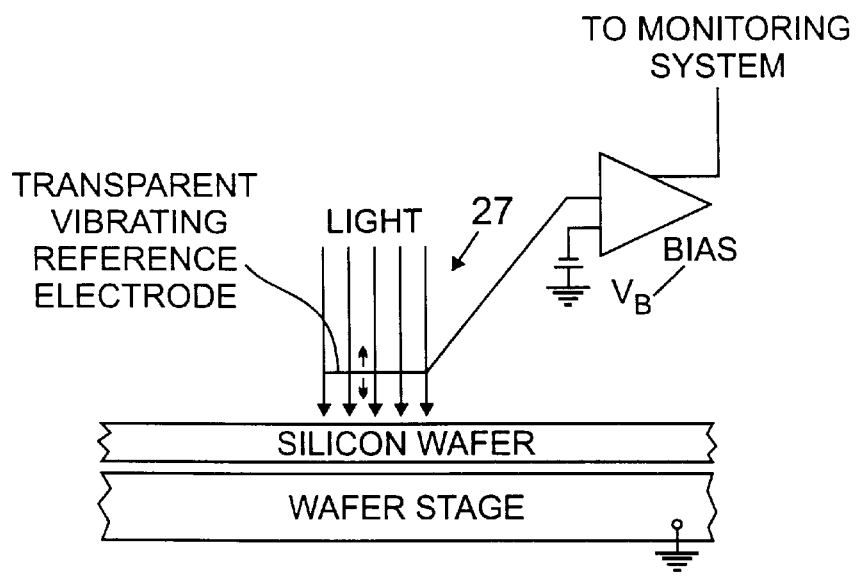

Referring to FIG. 2A and 2B, the CCSB measurement station 20 includes a Monroe-type sensor 22, positioned over a stage 23, for measuring the contact potential in dark and illuminated light conditions with respect to a reference electrode of a probe 25. Probe 25 is used to provide electrical signals representative of the semiconductor surface potential to computer 18 through an amplifier circuit 21. In use, probe 25 is spaced from wafer 2 by an air gap of about a millimeter or less. Wafer 2 is held in place on stage 23 with a vacuum system such as that which is described in U.S. Pat. No. 5,773,989.

Sensor 22 includes a light source (not shown) which illuminates the portion of the wafer under examination. In one embodiment, a fiber optic bundle is positioned to the side of probe 25 to convey the light from the light source at an angle as shown in FIG. 2A. Where greater intensity of the illumination is required, a second fiber optic bundle may be provided on the opposite side of probe 25.

Referring to FIG. 2B, in an alternative embodiment, a Kelvin-type probe 27 is used in which the light is directed through the probe itself. Kelvin and Monroe type sensors are described, respectively, in G. W. Reedyk and M. M. Perlman: Journal of the Electrochemical Society, Vol. 115, p. 49 (1968); and in R. E. Vosteen: Conference Records, 1974 IEEE-IAS 9th Annual Meeting, p. 799, the entire contents of which are incorporated herein by reference. An example of a commercially available Monroe-type device is the Isoprobe model 162 by Monroe Electronics, Lyndonville, N.Y. 14098.

As will be described in greater detail below, CCSB measurement station 20 is used to ensure that the semiconductor surface potential barrier $V_s$ is within an optimum range prior to continuing with measuring the modulated light AC-surface photovoltage $\Delta V_{spv}$ required for determining the generation lifetime of the thin epitaxial layer on the wafer.

Elevated AC-SPV measurement station 30 includes a pair of temperature-controlled wafer chucks 32, 34 each of which includes electric heating and air-cooling elements (not shown) for controlling the temperature of the chucks to a pre-selected temperature from e.g., 30–100° C. Both chucks 32, 34 hold the wafer by means of a vacuum suction which assures good thermal contact. Wafer chucks 32, 34 are individually controlled by computer 18 to maintain the temperature across the surface of respective chucks within about 1° C. As will be discussed in greater detail below, because the process for determining the generation lifetime requires performing measurements at least two different elevated temperatures, separate wafer chucks 32, 34 are used to eliminate waiting periods associated with increasing/decreasing the temperature of a single chuck.

Elevated AC-SPV measurement station 30 includes a measurement probe 36 for measuring the AC small signal surface photovoltage (e.g., 1 $\mu$V–10 mV) as a function of the frequency (e.g., 0.1 Hz to $10^5$ Hz) of chopped illumination light. Light should be of the wavelength shorter than 0.8 $\mu$m to be absorbed within less than 10 $\mu$m beneath the surface of the silicon wafer 2. The illumination light is provided by a light source (not shown), for example, a red, yellow or green LED having a light output pulsed from an LED power supply or a variable frequency light-chopping circuit. An exemplary measurement probe suitable for this application is described in Lagowski U.S. Pat. No. 5,177,351, in Lagowski, "Determining Long Minority Carrier Diffusion Length", U.S. Ser. No. 08/312119, filed Aug. 26, 1994, and in Lagowski, "Measurement of the Mobile Ion Concentration in the Oxide Layer of a Semiconductor Wafer", U.S. Ser. No. 08/502660, filed Jul. 14, 1995, the entire contents of which are incorporated herein by reference. A suitable device is also described in: P. Edelman, J. Lagowski, L. Jastrzebski, "Surface Charge Imaging in Semiconductor Wafers by Surface Photovoltage (SPV)" MRS Symposium Proceedings, 261, pp. 223 (1992), the entire contents of which are incorporated by reference.

Measurement probe 36 is mounted to a Y-axis positioner 38 which moves probe 36 over wafer chucks 32, 34 in a Y direction. Wafer chucks 32, 34 are both mounted to an X-axis positioner 40 which moves chucks 32, 34 beneath measurement probe 36 in an X direction. Y-axis positioner 38 and X-axis positioner 40 move in response to control signals from computer 18.

Test system 10 further includes a wafer cassette holder 14 for storing the semiconductor wafers to be tested and a prealigning stage 16 for accurate positioning of the wafer as it is moved from device to device, thereby minimizing positioning errors from measurement to measurement. The prealigner station 16 is used for pre-orientation of wafer prior to measurement by using a notch or flat formed by wafer manufacturers near the edge of the circular wafer for registration purposes.

Measurement Procedure

The measurement procedure provides a non-contact approach for measuring the generation lifetime within depletion layers, the value being representative of the amount of impurity contaminants within the depletion layer, a region just below the wafer surface having a thickness of about 1$\mu$ or less, where virtually no free carriers (electrons and holes) are present. The procedure enables probing thin epitaxial layers so long as the thickness of the depletion layer is less than the thickness of the epitaxial layers.

Figure 3:
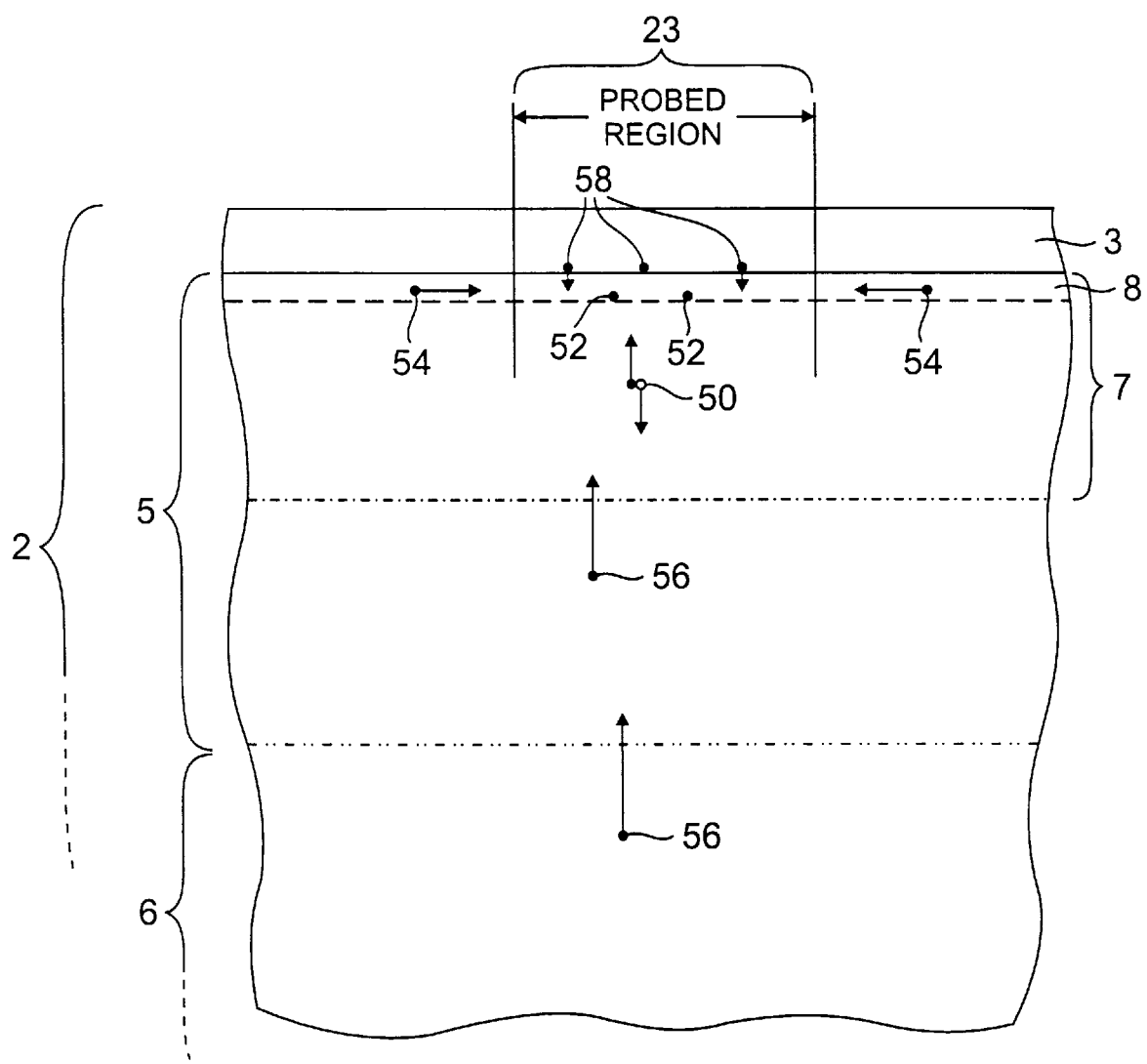
FIG. 3 is a cross-sectional view of a semiconductor having a weak inversion layer formed over a depletion layer.

With reference to FIG. 3, a silicon semiconductor wafer 2 includes a $SiO_2$ layer 3 formed over a relatively thin epitaxial layer 5 which in turn is formed over the bulk region 6 of the semiconductor wafer. Epitaxial layer 5 includes a diffusion layer 7 having a relatively weak surface inversion layer 8 just below the interface with $SiO_2$ layer 3.

In response to illumination directed onto the surface of semiconductor wafer 2, excess electron-hole pairs 50 are generated within depletion layer 7 which alter inversion layer 8 having minority carriers 52. Supply of these minority carriers 52 from the depletion layer 7 (where they are generated by process 50 but do not stay due to electric field) is desired to be the dominant source of minority carriers in the generation lifetime characteristic being measured. However, other sources of minority carriers can exist which interfere with the detection of minority carrier generation in an illuminated probe region 53 of wafer 2. For example, minority carriers 54 outside the illuminated probe region 53 and within surface inversion layer 8 may be present. Minority carriers 56 generated within epitaxial layer bulk region 6 and in the substrate may also be present. Interface traps within $SiO_2$ layer 3 may also be a source of minority carriers 58.

As will be described in greater detail below, the measurement procedure of the invention is performed in a manner that the generation lifetime within the depletion layer is the dominant mechanism for generating minority carriers and the influence of minority carriers 54 (from outside the illuminated probe region 23) due to lateral transport phenomena in surface inversion layer 8, minority carriers 56 supplied from bulk region 6 and minority carriers 58 from $SiO_2$ are all minimized.

Figure 4:
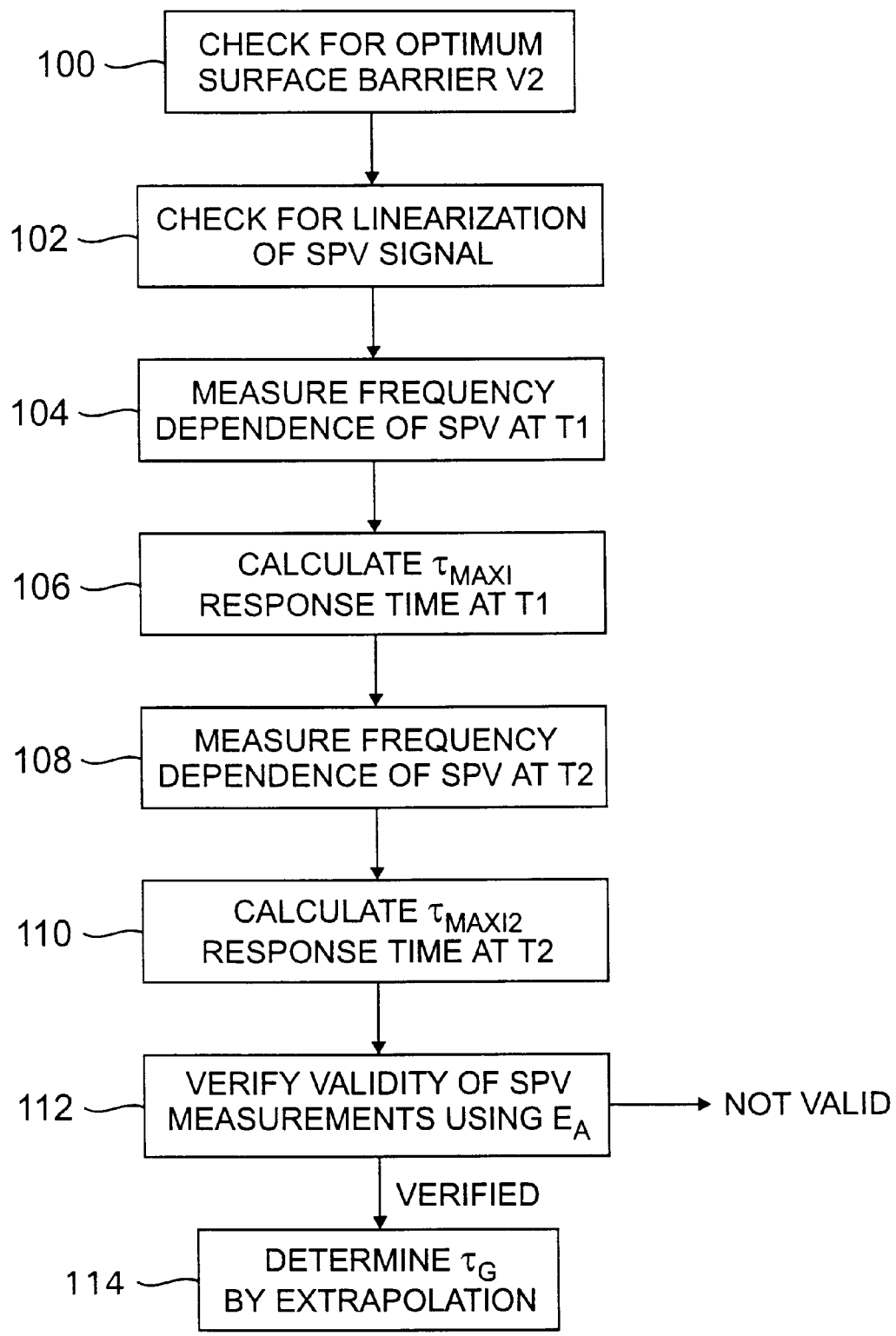
FIG. 4 is a flow diagram illustrating the steps for measuring the generation lifetime within a depletion layer.

With reference to FIG. 4, a flow chart illustrates the approach for determining the generation lifetime within a depletion layer of a semiconductor substrate.

The presence of a weak inversion layer 8 above depletion layer 7 is required for detecting the behavior of the minority carriers and for performing surface photovoltage measurements used to measure the minority carrier generation lifetime within depletion layer 7. If the inversion layer is too strong, the supply of minority carriers from inversion layer 8 around illuminated probe region 53 will dominate, thereby interfering with the measurement of minority carriers generated thermally from impurities within the depletion layer 7.

To ensure that the surface barrier potential is within a range consistent with providing a weak inversion layer 8, the wafer is moved to stage 23 of CCSB measurement station 20 where photovoltage transducer probe 24 is used to determine the surface barrier potential $V_s$ (step 100). To do so, the contact potential difference $V_{CPD}$ of the wafer is measured under dark light conditions to obtain $V_{CPD}^{dark}$. The $V_{CPD}$ is also measured with the wafer subjected to constant, strong illumination to obtain $V_{CPD}^{ill}$. The value of the surface barrier potential $V_s$ is then determined as follows:

$$V_s = V_{CPD}^{dark} - V_{CPD}^{ill}$$

The value of $V_s$ is compared with an optimal range corresponding to a weak inversion layer. For p-type silicon, the optimal range is:

$$\frac{kT}{q}\ln\frac{N_a}{n_i} \leq V_s < 2\frac{kT}{q}\ln\frac{N_a}{n_i}$$

where:

$n_i = 1.4 \text{ e } 10 \text{ cm}^{-3}$ is the intrinsic carrier concentration in silicon at room temperature;

$kT = 0.026$ eV (the thermal energy);

q is the elemental charge; and $N_a$ is the acceptor concentration in silicon.

For silicon with a dopant concentration between $10^{14}$ and $10^{16}$ cm$^{-3}$, an optimum range for the surface barrier potential $V_s$ is from about 0.25 V to 0.50 V.

Figure 5:
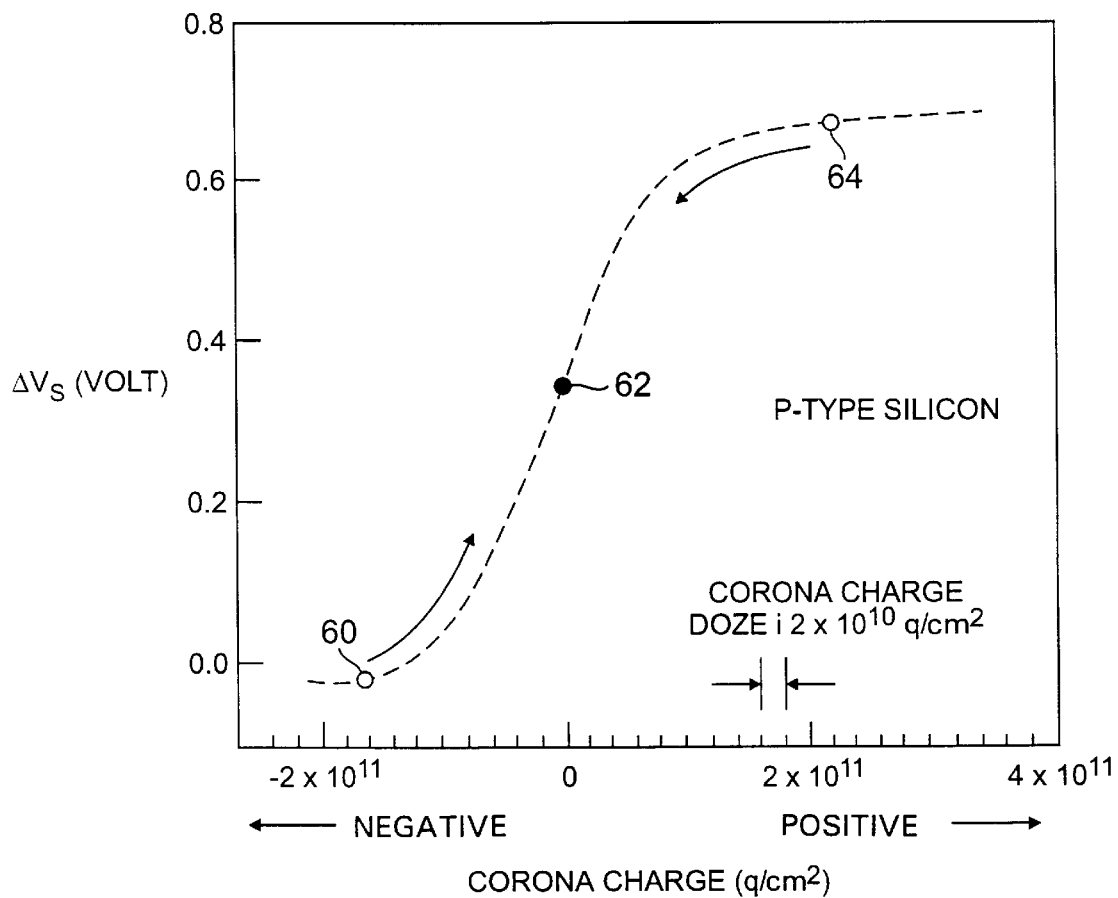
FIG. 5 is a plot of the surface potential barrier $\Delta V_s$ as a function of electrical charge placed on the surface.

If $V_s$ is too small, for example $V_s = -0.01$ V, shown as point 60 in the FIG. 5, then a positive corona is deposited on SiO$_2$ layer 3 in small doses of about $2 \times 10^{10}$ charge/cm$^2$ per dose with photovoltage transducer probe by passing wafer 2 under a corona charging wire 24 connected to a DC voltage supply (not shown). $V_s$ is measured with probe 25 after each dose. The charging is continued until $V_s$ reaches a value within an optimum range (shown as point 62).

If $V_s$ is too large, for example 0.67 V, shown as point 64, than a negative corona charge is deposited in small doses until $V_s$ is reduced to a value within the optimum range.

Upon determining that the surface barrier potential $V_s$ is within the appropriate range, wafer 2 is transferred to temperature-controlled wafer chuck 32 of elevated AC-SPV measurement station 30 which has been preheated to a temperature $T_1$ in a range between 40–60° C.

Before measuring the small signal AC $\Delta V_{spv}$ as a function of light-chopping frequency, it is important that the intensity of the illuminating light be sufficiently low to ensure linearity between the $\Delta V_{spv}$ and light intensity (step 102). To verify that this condition is met, the magnitude of the surface photovoltage $\Delta V_{spv}$ of wafer 2 is measured with probe 36 under low-light illumination at two light intensities $I_1$ and $I_2$ and illumination modulated at a chopping frequency in a range between 1–10 Hz. It is desired that the linearity be within 2.5%, as expressed by the following relationship:

$$\frac{\Delta V_{SPV1}}{\Delta V_{SPV2}} = a\frac{I_1}{I_2}$$

where:

$0.975 \leq a \leq 1.00$ and $\Delta V_{SPV1}$ and $\Delta V_{SPV2}$ correspond to $I_1$ and $I_2$, respectively.

This condition is typically satisfied when $\Delta V_{spv}$ is smaller than 5 mV. Adjusting the light intensity (I) to provide a linear relationship between the surface photovoltage and the light intensity can be accomplished by changing the supply current to the light source (e.g., light emitting diode). Alternatively, a pre-calibrated neutral density filter can be inserted into the light path of the light source.

After adjusting light intensity I to ensure measurement within a linear $\Delta V_{spv}$ range, small signal AC surface photovoltage (SPV) measurements with probe 36 as a function of light-chopping frequency can be performed.

Figure 6:
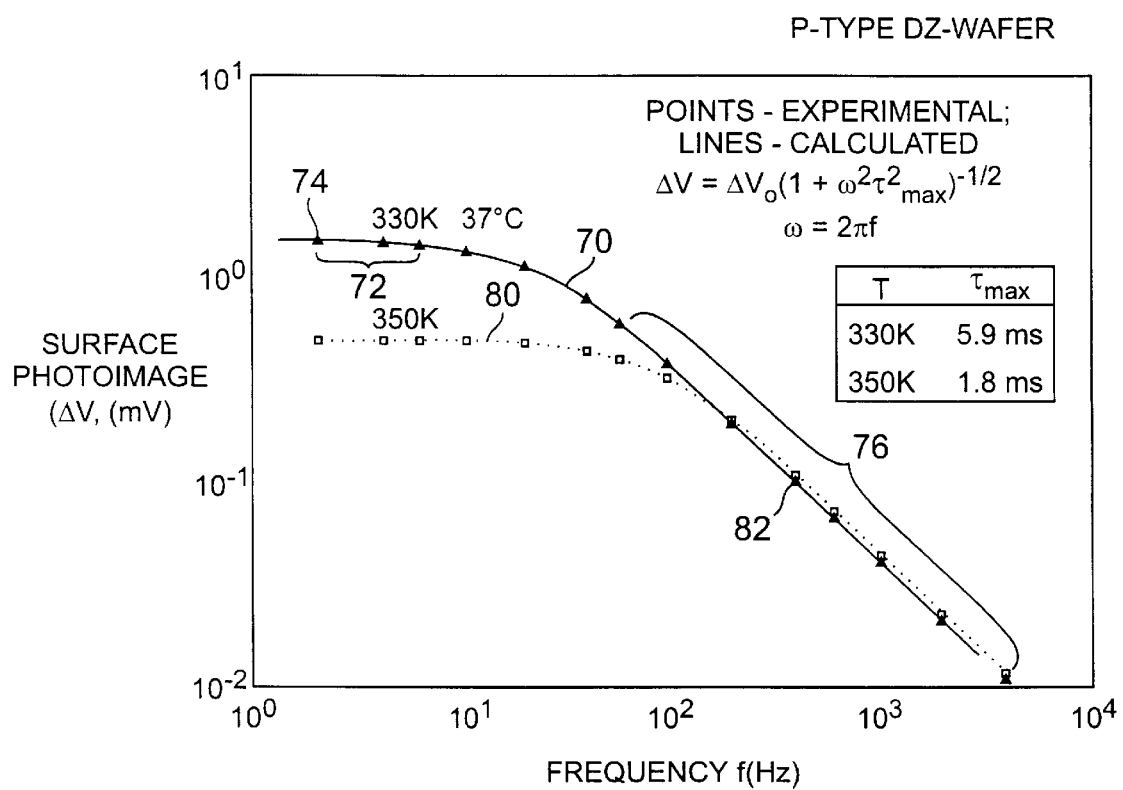
FIG. 6 is a plot of AC surface photovoltage (i.e., photovoltage induced by a modulated light) as a function of modulation frequency at various temperatures.

Referring to FIG. 6, with wafer chuck 32 heated to 57° C., $\Delta V_{spv}$ is measured while the light-chopping frequency is varied or swept over a frequency range extending from about 2 Hz to about 5 KHz, thereby producing a curve 70 (corresponding to 57° C. or 330° K) (step 104). The frequency range must extend from a low frequency plateau region 72 ($\Delta V_{spv} \equiv \Delta V_o$) including the frequency (point 74) where $\Delta V_o$ is measured, to a high frequency linear (i.e., $\Delta V_{SPV} \equiv \Delta V \sim f^{-1}$) region 76.

The SPV response time $\tau_{max1}$ at $T_1$ is calculated using the following relationship:

$$\tau_{max1} = \omega^{-1}[(\Delta V_o/\Delta V)^2 - 1]^{1/2} \text{ where } \omega = 2\pi f \quad \text{(step 106)}.$$

$\omega$ corresponds to the $f$ value at which $\Delta V$ value is taken, for example point 82.

At $T_1$ of 57° C., $\Delta V_o$ is measured at a frequency $f \leq 5$ Hz while $\Delta V$ is measured at a frequency $\geq 100$ Hz. At these frequencies, the calculated value of $\tau_{max1}$ is 5.9 ms.

Wafer 2 is then transferred to the measuring stage associated with wafer chuck 34 which is pre-heated to an elevated temperature $T_2$ (e.g., 77° C. or 350° K) and the magnitude of the SPV signal is measured again as a function of frequency, thereby producing curve 80 (step 108).

The response time at $T_2$ is calculated using the following relationship:

$$\tau_{max2} = \omega^{-1}[(\Delta V_o/\Delta V)^2 - 1]^{1/2} \text{ where } \omega = 2\pi f \quad \text{(step 110)}.$$

The values of frequencies used to select the plateau value $\Delta V_o$ and the linear $\Delta V$ for $T_2$ are typically higher than those for $T_1$ because of the shift of the plateau to a higher frequency range. The value corresponding to the curve 80 in FIG. 6 is $\tau_{max2} = 1.8$ ms.

In order to verify the validity of the measurements used to calculate $\tau_{max1}$ and $\tau_{max2}$, the response time activation energy, $E_A$, is determined using the following expression:

$$E_A = k(ln\ \tau_1/\tau_2)\ (T_1\ T_2)/(T_2 - T_1)$$

where $\tau_1$ and $\tau_2$ are the values of $\tau_{max}$ at absolute temperature $T_1$ and $T_2$ respectively, and k is the Boltzman constant ($k = 8.6 \times 10^{-5}$ eVK$^{-1}$).

Using the values for $\tau_{max1} = 5.9$ ms and $\tau_{max2} = 1.8$ ms obtained above, $E_A = 0.59$ eV. This value is verified to ensure that it falls within a theoretically expected $E_A$ range (step 112) for energy levels near the middle of the energy gap contributing to the generation of minority carriers within a depletion layer. For silicon, the energy gap is 1.1 eV, and ideally $E_a=0.55$ eV. The total expected energy level range is 0.4 to 0.7 eV. Lower or higher values of $E_A$ generally indicate that other minority carrier supply mechanisms, such as the lateral transport mechanism are contributing significantly. In this case, the energy level value of $E_A=0.59$ eV is within the expected range and, thus the measurement result is valid.

The response time value at room temperature $T_o=295°$ K ($22°$ C.) is extrapolated from the response time at either $T_1$ or $T_2$ using the value of activation energy. Extrapolation from $T_2$ gives:

$$\tau_G = \tau_2 \cdot \exp[(T_2-T_o)E_A/kT_o \cdot T_2] \quad \text{(step 114)}.$$

For the values used in the example above, the minority carrier depletion layer lifetime $\tau_G = 70$ ms.

Temperatures $T_1$ and $T_2$ of wafer chucks 32, 34, respectively, are required to be within an optimum range to assure that the depletion layer lifetime $\tau_G$ measurement is indicative of the minority carrier generation in the depletion layer and not of other interfering mechanisms. For temperatures outside this range, other minority carrier supply processes dominate. Thus for lower temperatures the lateral transport and supply from the interface states may dominate. At higher temperatures, the generation of minority carrier via the energy gap, rather than from the impurity levels become dominant.

For single point measurements, the center of the wafer is typically selected for performing the measurements described above. Carrier charging to adjust the surface barrier height is done once for the whole wafer using the whole wafer charging station 24. Thus measurements can be performed as well at other preselected of sites on the wafer. Moreover, because higher frequencies can be used to determine the response time at elevated temperatures, the measurements can be performed more quickly. Thus, mapping of the entire wafer can also be performed more quickly (e.g., 10 to 20 minutes per wafer) than if performed at room temperature (i.e., $22°$ C.).

In a high accuracy mapping procedure, the AC-SPV measuring steps described above are performed at every desired point of the wafer. This procedure is accurate because an activation energy $E_A$ is calculated for every point.

On the other hand, a still relatively accurate mapping approach can be used to increase the speed of the mapping procedure. In this procedure, the measuring steps are performed at a single point (preferably the center) as described above. After completion of this process, two sets of measurements are performed with wafer 2 positioned on wafer chuck 34. The position of wafer 2 is changed using X and Y positioners 38, 40 to map the entire surface. First, the $\Delta V_{spv}$ at the low frequency (e.g., 20 Hz) is mapped at points across the surface and stored within computer 18. Then $\Delta V_{spv}$ is measured at a high frequency (e.g., 500 Hz). The SPV response time $\tau_{max2}$ is determined for each point and corresponding values of $\tau_G$ at every point are extrapolated to room temperature.

Other embodiments are within the scope of the claims.

What is claimed is:

1. A method for determining a depletion layer minority carrier lifetime $\tau_o$ in a depletion layer within a semiconductor wafer comprising:

a) measuring a first surface photovoltage $\Delta V_{o1}$ at a selected point of the wafer, at a temperature $T_1$ in a range between $303°$ K–$373°$ K and at a low light modulation frequency;

b) measuring a second surface photovoltage $\Delta V_1$ at the selected point, at a temperature $T_2$ and at a frequency $\omega$ within the frequency range where the surface photovoltage is inversely proportional to frequency;

c) determining a surface photovoltage response time $\tau_{max1}$ of the selected point by:

$$\tau_{max1} = \omega^{-1}\{(\Delta V_{o1}/\Delta V_1)^2 - 1\}^{1/2};$$

and d) determining the depletion layer lifetime $\tau_o$ by:

$$\tau_o = \tau_{max1} \cdot \exp[(T_2-T_0)E_A/kT_o \cdot T_2]$$

where
    $T_o$ is room temperature,
    $k = 8.6 \times 10^{-5}$ eVK$^{-1}$,
    $E_A = k(\ln \tau_1/\tau_2) \cdot (T_1 \cdot T_2)/(T_2-T_1)$,
    where $\tau_1$ and $\tau_2$ are the values of $\tau_{max1}$ at temperatures $T_1$ and $T_2$.

2. A method for determining a depletion layer minority carrier lifetime $\tau_o$ in a depletion layer within a semiconductor wafer comprising:

a) inducing a depletion or inversion layer on a surface of the semiconductor wafer;

b) heating the semiconductor wafer to a first temperature $T_1$ in a range between $303°$ K–$373°$ K;

c) inducing a surface photovoltage on the surface of the semiconductor wafer with modulated light;

d) measuring a first surface photovoltage $\Delta V_{o1}$ at a selected point of the wafer, at $T_1$ and at a low light modulation frequency where the surface photovoltage is independent of frequency;

e) measuring a second surface photovoltage $\Delta V_1$ at the selected point, at $T_1$, at a higher light modulation frequency $\omega$ which is within a frequency range where the surface photovoltage is inversely proportional to frequency;

f) determining a first surface photovoltage response time $\tau_{max1}$ of the selected point by:

$$\tau_{max1} = \omega_1^{-1}\{(\Delta V_{o1}/\Delta V_1)^2 - 1\}^{1/2};$$

g) heating the semiconductor wafer to a second temperature $T_2$ in the range between $303°$ K–$373°$ K, the second temperature $T_2$ greater than the first temperature $T_1$;

h) measuring a third surface photovoltage $\Delta V_{o2}$ at the selected point, at $T_2$ and at the low light modulation frequency;

i) measuring a fourth surface photovoltage $\Delta V_2$ at the selected point, at $T_2$ and at a frequency $\omega_2$ within the frequency range where the surface photovoltage is inversely proportional to frequency;

j) determining a second surface photovoltage response time $\tau_{max2}$ of the selected point by:

$$\tau_{max2} = \omega_2^{-1}\{(\Delta V_{o2}/\Delta V_2)^2 - 1\}^{1/2}; \text{ and}$$

k) determining the depletion layer lifetime $\tau_o$ by:

$$\tau_0 = \tau_{max2} \cdot \exp\{(T_2-T_0)E_A/kT_o \cdot T_2\}$$

where $T_o$ is room temperature.

3. The method of claim 2 further comprising, between steps j) and k), determining a response time activation energy $E_A$ by:

$$E_A = k(\ln \tau_{max1}/\tau_{max2})(T_1 \cdot T_2)/(T_2-T_1),$$

the value of $E_A$ indicating the validity of the depletion layer minority carrier lifetime measurement.

4. The method of claim 2 wherein temperature $T_1$ is in a range between about 40 to 60° C.

5. The method of claim 2 wherein temperature $T_2$ is in a range between about 60 to 80° C.

6. The method of claim 2 wherein the low light modulation frequency is in a range between 0.1 to 100 Hz.

7. The method of claim 2 wherein frequency $\omega$ is in a range between 100 to 5 KHz.

8. The method of claim 2 further comprising, between steps a) and b), adjusting the surface barrier to ensure that it is within an optimal range defined by:

$$\frac{kT}{q}\ln\frac{N_a}{n_i} \leq V_s < 2\frac{kT}{q}\ln\frac{N_a}{n_i}.$$

9. The method of claim 8 further comprising depositing a positive corona on the wafer in doses of about $2\times10^{10}$ charge/cm² per dose, if:

$$V_s < 2\frac{kT}{q}\ln\frac{N_a}{n_i}$$

until $V_s$ is within the optimal range.

10. The method of claim 8 further comprising depositing a negative corona on the wafer in doses of about $2\times10^{10}$ charge/cm² per dose, if:

$$V_s > \frac{kT}{q}\ln\frac{N_a}{n_i}$$

until $V_s$ is within the optimal range.

11. A system for determining a depletion layer minority carrier lifetime $\tau_o$ in a depletion layer within a semiconductor wafer, the system comprising a measurement device configured to measure a series of surface photovoltages including:

a first surface photovoltage $\Delta V_{o1}$ at a first temperature $T_1$ and at a low light modulation frequency where the surface photovoltage is independent of frequency;

a second surface photovoltage $\Delta V_1$ at $T_1$ and at a frequency $\omega$ which is higher than the low light modulation frequency and where the surface photovoltage is inversely proportional to frequency;

a third surface photovoltage $\Delta V_{o2}$ at a second temperature $T_2$ and at the low light modulation frequency;

a fourth surface photovoltage $\Delta V_2$ at $T_2$ and at the frequency; and a controller which receives electrical signals representative of the first, second, third and fourth photovoltages and determines:

a first surface photovoltage response time $\tau_{max1}$ by:

$$\tau_{max1}=\omega_1^{-1}[(\Delta V_{o1}/\Delta V_1)^2-1]^{1/2};$$

a second surface photovoltage response time $\tau_{max2}$ by:

$$\tau_{max2}=\omega_2^{-1}[(\Delta V_{o2}/\Delta V_2)^2-1]^{1/2};\text{ and}$$

a depletion layer lifetime $\tau_o$ by:

$$\tau_0=\tau_{max2}\cdot\exp\,[(T_2-T_0)E_A/kT_o\cdot T_2]$$

where $T_o$ is room temperature.

12. The system of claim 11 further comprising a first variable-temperature wafer stage configured to support and heat the semiconductor wafer at temperature $T_1$ and a second variable-temperature wafer stage configured to support and heat the semiconductor wafer at temperature $T_2$.

13. The system of claim 11 further comprising a charge deposition device configured to induce a depletion or inversion layer on a surface of the semiconductor wafer.

14. The system of claim 11 further comprising a charge deposition device configured to induce a depletion or inversion layer on a surface of the semiconductor wafer.

* * * * *